US010032584B2

(12) United States Patent
Lui et al.

(10) Patent No.: US 10,032,584 B2
(45) Date of Patent: Jul. 24, 2018

(54) ROBUST SEMICONDUCTOR POWER DEVICES WITH DESIGN TO PROTECT TRANSISTOR CELLS WITH SLOWER SWITCHING SPEED

(71) Applicants: Sik K. Lui, Sunnyvale, CA (US); Anup Bhalla, Santa Clara, CA (US)

(72) Inventors: Sik K. Lui, Sunnyvale, CA (US); Anup Bhalla, Santa Clara, CA (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 543 days.

(21) Appl. No.: 14/585,201

(22) Filed: Dec. 30, 2014

(65) Prior Publication Data

US 2016/0191048 A1 Jun. 30, 2016
US 2018/0138906 A9 May 17, 2018

Related U.S. Application Data

(62) Division of application No. 12/074,327, filed on Mar. 3, 2008, now Pat. No. 8,946,942.

(51) Int. Cl.
*H01H 49/00* (2006.01)
*H03K 17/687* (2006.01)
*H03K 17/0412* (2006.01)
*H03K 17/0812* (2006.01)
*H03K 17/12* (2006.01)

(52) U.S. Cl.
CPC ....... *H01H 49/00* (2013.01); *H03K 17/04123* (2013.01); *H03K 17/08122* (2013.01); *H03K 17/122* (2013.01)

(58) Field of Classification Search
None
See application file for complete search history.

(56) References Cited

U.S. PATENT DOCUMENTS

| | | | |
|---|---|---|---|
| 6,441,410 B2 * | 8/2002 | Gauthier, Jr. | H01L 21/28518 257/256 |
| 6,747,505 B1 * | 6/2004 | Gergintschew | H03K 17/164 327/404 |
| 2007/0004055 A1 * | 1/2007 | Ball | H01L 23/34 438/14 |

* cited by examiner

*Primary Examiner* — Jared Fureman
*Assistant Examiner* — Aqeel Bukhari
(74) *Attorney, Agent, or Firm* — Bo-In Lin

(57) ABSTRACT

This invention discloses a power switch that includes a fast-switch semiconductor power device and a slow-switch semiconductor power device controllable to turn on and off a current transmitting therethrough. The slow-switch semiconductor power device further includes a ballasting resistor for increasing a device robustness of the slow switch semiconductor power device. In an exemplary embodiment, the fast-switch semiconductor power device includes a fast switch metal oxide semiconductor field effect transistor (MOSFET) and the slow-switch semiconductor power device includes a slow switch MOSFET wherein the slow switch MOSFET further includes a source ballasting resistor.

9 Claims, 5 Drawing Sheets

ROBUST SEMICONDUCTOR POWER DEVICES WITH DESIGN TO PROTECT TRANSISTOR CELLS WITH SLOWER SWITCHING SPEED

This is a Divisional Application of a previously filed co-pending application Ser. No. 12/074,327 filed on Mar. 3, 2008 by common inventors of this Application. The disclosures made in application Ser. No. 12/074,327 are hereby incorporated by reference in this Patent Application.

BACKGROUND OF THE INVENTION

1. Field of the Invention

The invention relates generally to the semiconductor power devices. More particularly, this invention relates to configurations and methods of manufacturing of semiconductor power devices comprise transistor cells with non-uniform cell characteristics of robustness to protect the slow switching power semiconductor devices for improving the device reliability.

2. Description of the Prior Art

Conventional technologies of manufacturing and configuring semiconductor power devices are still confronted with a technical difficulty that the transistor cells with slower switching speed in the power devices are often vulnerable to over-current damages when the power devices are implemented for switching off an electric connection. Specifically, when an electrical connection is switched on or off and before the operation reaches a steady state, a transient state takes place. In this initial transient state, the switch on or off operations causes a relatively large current and voltage spike. The voltage and current spikes may cause sparks and EMI in the electronic device and may lead to device damages and poor reliability. Certain applications do not require extremely fast switching rates. In these cases, a slow turn-on and turn-off gate signal is often employed to avoid excessively large voltage and current spikes. However this leads to problems that will be explained later.

FIG. 1A is a typical switching circuit implemented for switching on or off the power supply to an electronic device. A slow turning on or turning off operation is achieved by controlling the long rise and fall time of the signal provided to the gate of a semiconductor power device. The slow turning on and turning off of the device avoids excessive transient voltage and current spikes. Unfortunately, in the slow turning on or turning off operations, both high current and high voltage appears across the drain and source during the transition period, which can cause problems under certain conditions shown in FIG. 1B.

A standard power device consists of thousands of transistors working in parallel. However, if the transistors are not all perfectly uniform, as is often the reality, some of the transistors may switch off slower than the others. FIG. 1B shows a similar circuit diagram to FIG. 1B, except that the FIG. 1B categorizes the transistor cells as slow transistors and fast transistors. During the turning on or turning off transitions, not all the transistor cells in the semiconductor power device switch at the same speed. Some transistor cells are turned on or turned off before other transistor cells that have slower switching speed. During a switching off operation, the slower transistor cells often become the vulnerable cells to fail due to the situation that all other faster transistor cells are turned off. The power and current are then focused on a few slower transistor cells. The slower transistor cells are more likely to fail if the voltage and current are beyond the design limits of these transistor cells.

FIG. 1C is a circuit diagram for illustrating the conventional method to protect the circuit against damages caused by the switching transitions. The protective measure against the damages that may occur during the switching transitions is by adding ballast resistors to every transistor cell to improve the current uniformity over all the transistor cells. The conventional techniques of adding ballast resistors to all the transistor cells to improve the current and voltage uniformity however have the disadvantage that the on resistance, Rdson, of the transistors are significantly increased thus degrading the device operation. Adding ballast resistors to all the transistor cells further increases the silicon areas required for manufacturing the power device thus increasing the production costs of the device.

Specifically, the source ballasting techniques have been disclosed in U.S. Pat. Nos. 5,475,252, 5,763,919, 6,268,286, 6,331,726, 6,441,410, 6,583,972, 6,587,320, and 6,927,458. The semiconductor power devices such as MOSFET devices disclosed in these patented inventions implement a technique of uniform ballasting. However, as discussed above, the Rdson is greatly increased and the device performance is adversely affected due to the uniform addition of the source resistance by implementing the conventional ballasting technologies.

Therefore, a need still exists in the art of power semiconductor device design and manufacture to provide new device configurations and methods of manufacturing the power devices such that the above discussed problems and limitations can be resolved.

SUMMARY OF THE PRESENT INVENTION

It is therefore an aspect of the present invention to provide a new and improved device configuration and method of manufacturing the semiconductor power device with specially arranged faster and slower switching transistor cells and providing additional source ballasting to the slower switching transistor cells for protecting these cells during the operations of turning off transitions. The slower transistor cells are designed to remain on longer while other transistor cells are turned off during a turning off operation. Instead of using a uniform ballasting configuration, only the slower switching transistor cells are added with ballasting protection such that the significant Rdson increase may be reduced and the above-discussed difficulties can be resolved. By designing a sufficient number of the transistors cells to be slower switching, the turn-off power will be safely spread among those cells, and not just focused on very few cells. Ballast resistors ensure even current distribution among the slow transistor cells therefore increasing the robustness.

Specifically, it is an aspect of the present invention to provide a new and improved device configuration and method of manufacturing the semiconductor power device by varying the amount of ballasting to strengthen the slower switching transistor cells with increased robustness to handle the power of high power and high voltage in the switching off transitions. Since only the slower transistor cells are adjusted, the overall increase of the Rdson in this invention is reduced and the additional area required for ballasting the transistor cells is also reduced. Specifically, the semiconductor power device is designed to have faster switching transistor cells and slower switching transistor cells. Only the slower switching transistor cells are designed and manufactured to have ballasting resistors to increase the robustness. The slower switching transistor cells can also be optimized for the high turn-off load by adjusting properties such as the cell density, ballast resistor values, and the percentage of slower switching transistor cells. Effective protection of the device against damages caused by the transitions of voltage and current during the turning off operations can therefore be achieved. The source ballasting distributions are selectively designed and manufactured in the semiconductor power devices with effective protection while minimizing the increase of the resistance and required silicon areas.

Briefly in a preferred embodiment this invention discloses a power switch that includes a fast-switch semiconductor power device and a slow-switch semiconductor power device controllable to turn on and off a current transmitting therethrough. The slow-switch semiconductor power device further includes a ballasting resistor for increasing a device robustness of the slow switch semiconductor power device. In an exemplary embodiment, the fast-switch semiconductor power device includes a fast switch metal oxide semiconductor field effect transistor (MOSFET) and the slow-switch semiconductor power device includes a slow switch MOSFET wherein the slow switch MOSFET further includes a source ballasting resistor. In one embodiment, the length of source region is increased in slow switch MOSFET cells to increase a source-ballasting resistor. In another embodiment, the source dopant concentration of source region is decreased in slow switch MOSFET cells to increase a source-ballasting resistor.

Furthermore, this invention discloses a method of manufacturing a semiconductor a switch device. The method includes a step of manufacturing a fast-switch semiconductor power device and a slow-switch semiconductor power device for controlling a turn-on and turn-off of a current transmitting therethrough and manufacturing the slow-switch semiconductor power device with a ballasting resistor for increasing a device robustness of the slow switch semiconductor power device. In an exemplary embodiment, the step of manufacturing the fast-switch semiconductor power device and the slow switch semiconductor power device further includes a step of manufacturing a fast switch metal oxide semiconductor field effect transistor (MOSFET) and a slow switch MOSFET with the slow switch MOSFET having a source ballasting resistor. In another exemplary embodiment, the step of manufacturing the slow switch semiconductor power device further including a step of disposing the slow switch semiconductor power device near approximately a central location of the power switch. In another exemplary embodiment, the step of manufacturing the slow switch semiconductor power device further including a step of disposing the slow switch semiconductor power device near approximately a peripheral location of the power switch. In one embodiment, the length of source region is increased in slow switch MOSFET cells to increase a source-ballasting resistor. In another embodiment, the source dopant concentration of source region is decreased in slow switch MOSFET cells to increase a source-ballasting resistor.

These and other objects and advantages of the present invention will no doubt become obvious to those of ordinary skill in the art after having read the following detailed description of the preferred embodiment, which is illustrated in the various drawing figures.

DETAILED DESCRIPTION OF THE METHOD

Figure 1A:
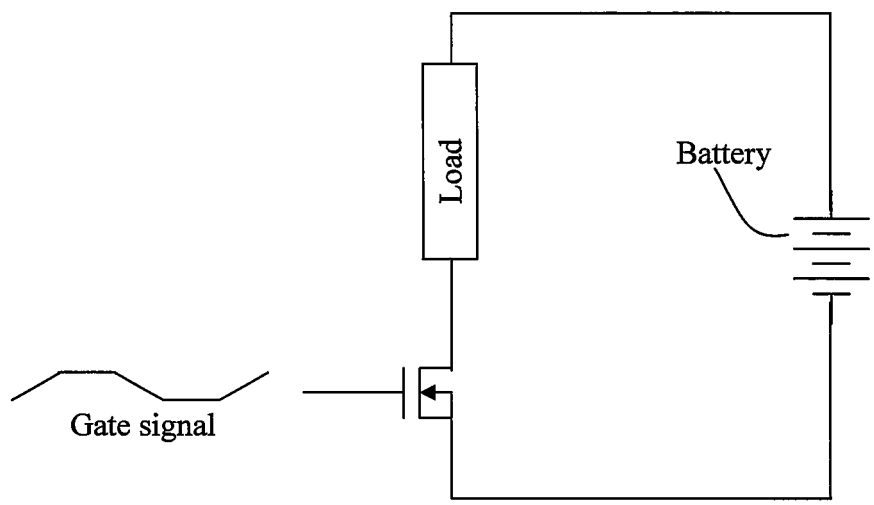
FIGS. 1A to 1C are circuit diagrams for depicting conventional circuits implemented with uniform ballasting source resistors for protecting the circuit from damages caused by voltage and current spikes during a turning on and turning off transitions.
Figure 1B:
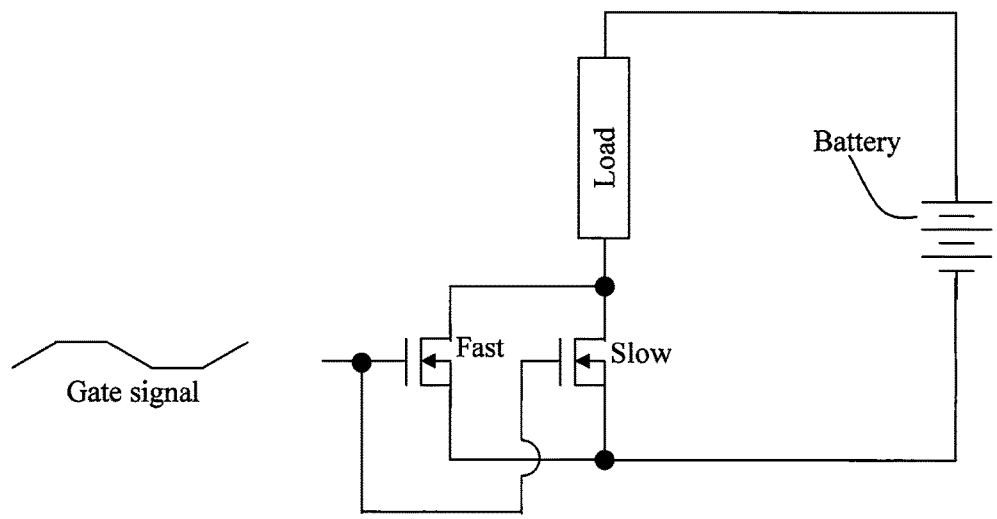
Figure 1C:
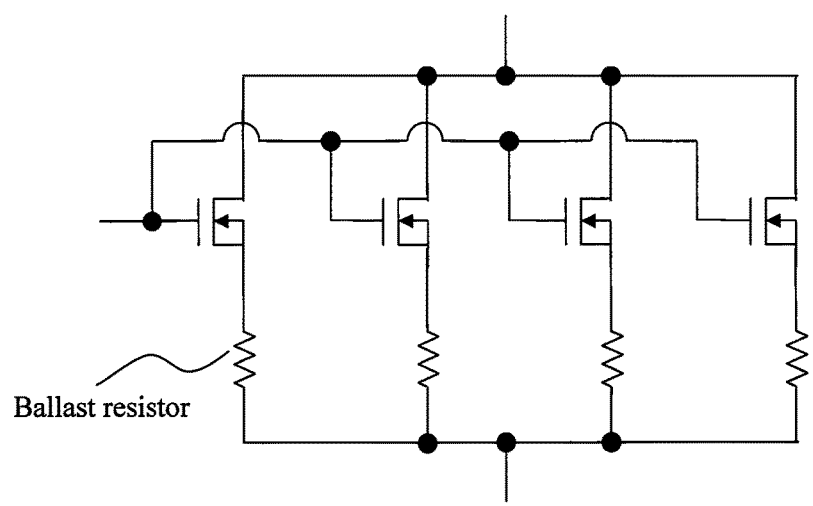
Figure 2:
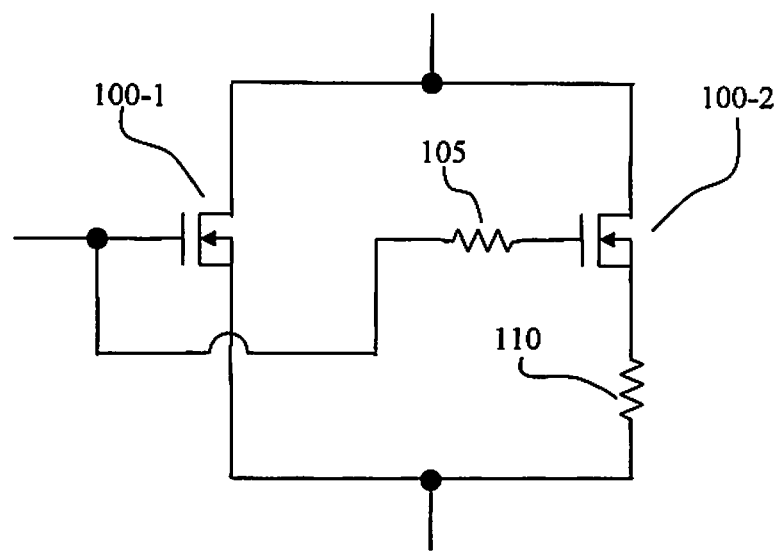
FIG. 2 is a circuit diagram for showing the implementation of the ballasting resistors on the slower transistor cells of a semiconductor power device.

Referring to FIG. 2 for a circuit diagram for illustrating the improved circuit configuration to resolve the difficulties encountered in the convention semiconductor power devices implemented to switch on and off an electronic device. The semiconductor power device includes a first MOSFET 100-1 and a second MOSFET 100-2 connected in parallel and each receives a gate signal to function as a switch. The first MOSFET 100-1 is a fast switch and a second MOSFET 100-2 as a slow switch. In order to protect the slower switching MOSFET 100-2, a ballasting resistor 110 is added to the second MOSFET 100-2. When a gate signal is received to turn off the electric current, the first MOSFET 100-1 is turned off first while the second MOSFET 100-2 is a slower switching MOSFET and still remains at an on state. In this embodiment, a gate resistor 105 is added to the second MOSFET 100-2. The gate resistor 105 along with the natural capacitance of the gate, form a resistor-capacitor (RC) circuit. During turn-off, the RC circuit will cause the gate voltage for the second MOSFET 100-2 to decrease more slowly than the gate voltage for the first MOSFET 100-1. The added ballasting resistor 110 is designed to increase the robustness of the slower switching MOSFET 100-2. With a strengthened robustness, the MOSFET 100-2 is enabled to handle the power of a high current and voltage. Problems of damages that may occur to the slower switching transistor cells during a circuit turning off operation due to current and voltage spikes imposed on the slower switching transistor cells are therefore prevented. The increase of the Rdson resistance is also decreased because the faster switching transistor cells, e.g., MOSFET 100-1, are implemented without adding ballasting resistors. The slower switching transistor cells, e.g., MOSFET 100-2, are designed to sustain certain voltage and current with increased robustness.

The design of the semiconductor power device is therefore designed to have specified power-handling capability based on the number of cells. Furthermore, the device is designed to handle the voltage and current spikes during the turning on and turning off operations. The slower switching transistor cells are designed to locate at specific locations, with predefined switching speed. Furthermore, the slower switching transistor cells, e.g., MOSFET 100-2, are ballasted with predefined resistance to have increased robustness to handle the transition during the turning off operation to assure the damages would not occur to the transistor cells of the semiconductor power device thus assure product reliability is properly protected. The ballast resistors 110 ensure even distribution of the current among the slow switch transistor cells, e.g. MOSFET 100-2. Other parameters can be adjusted to increase the robustness of the slow switch cells, such as the cell density, cell area, number of slow switch cells, and ballast resistor values.

Figure 3A:
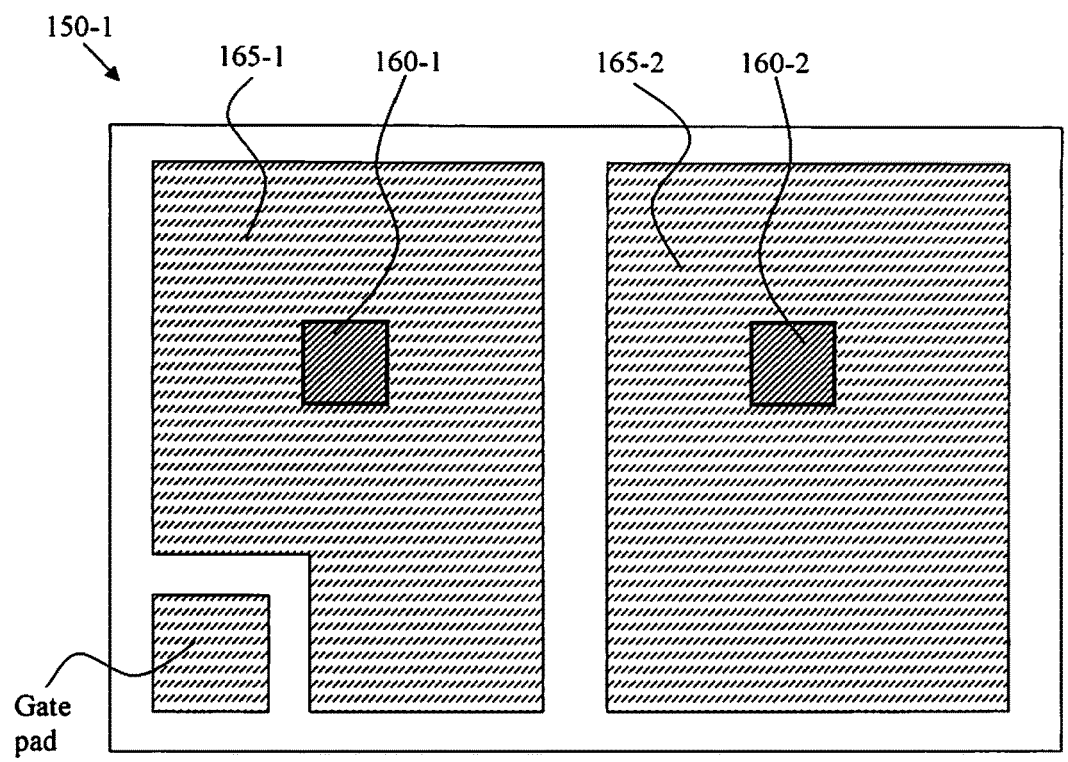
FIGS. 3A and 3B are two top views for showing the configuration of a semiconductor power device with designate areas provided implement slower transistor cells with ballasting resistors to improve product reliability.
Figure 3B:
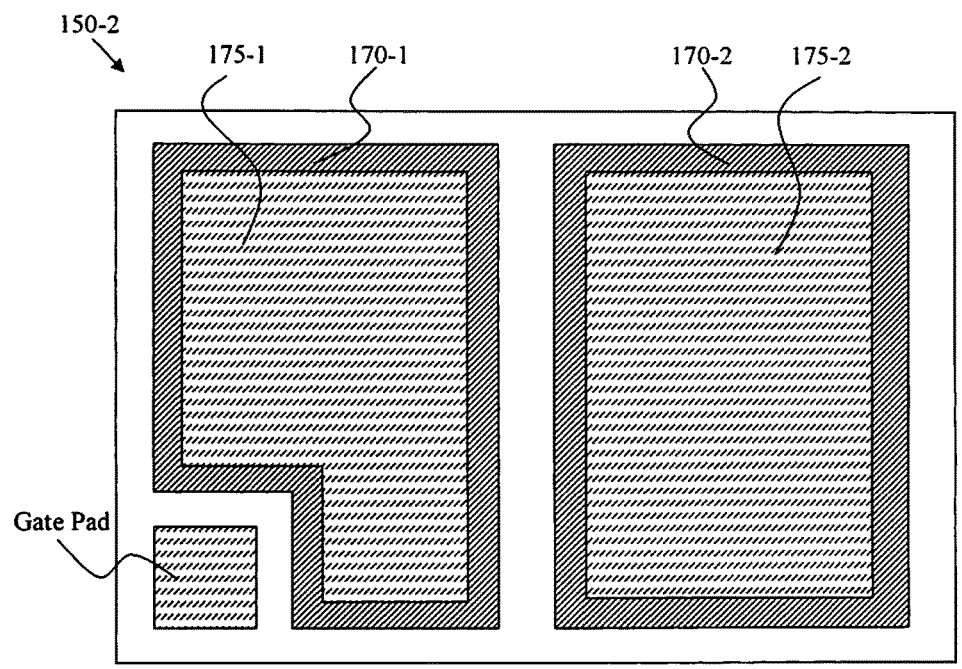

FIGS. 3A and 3B are two alternate top views for illustrating two semiconductor power devices 150-1 and 150-2. In FIG. 3A, two designated areas 160-1 and 160-2 are designed to have slower switching MOSFET cells. The transistor cells in the areas of 160-1 and 160-2 are ballasted with additional source resistance to increase the robustness of the transistor cells in these areas. The transistor cells other than these two areas are designed and manufactured as normal transistor cells without adding ballasting resistors. These normal cells are in the designated areas of 165-1 and 165-2. In FIG. 3B, two peripheral areas, e.g., areas 170-1 and 170-2 of the semiconductor device 150-2, are designed for implementing slower transistor cells. The transistor cells in the areas of 170-1 and 170-2 are ballasted with additional source resistance to increase the robustness of the transistor cells in these areas. The transistor cells other than these two areas are designed and manufactured as normal transistor cells without adding ballasted resistors. The normal transistor cells are in the areas of 175-1 and 175-2. As can be seen in FIGS. 3A and 3B, the slow switch MOSFET cells can be easily designed in different locations, shapes and sizes.

Figure 4:
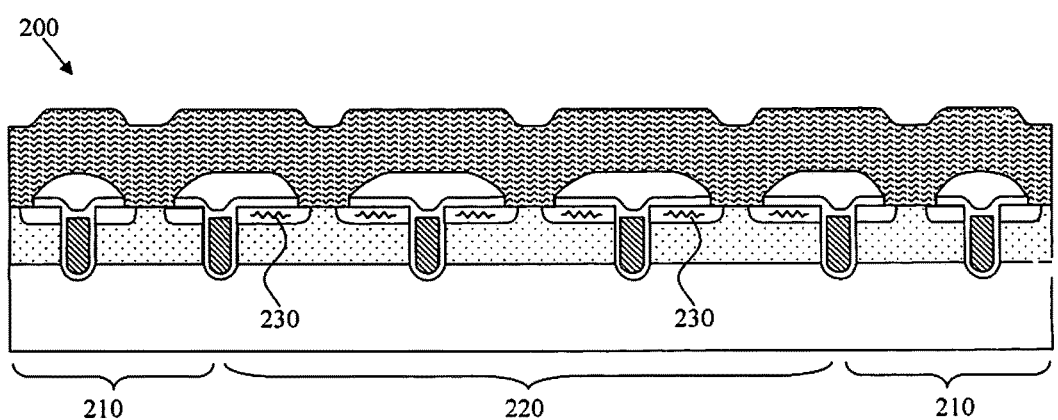
FIG. 4 is a cross section view for illustrating transistor cells of a semiconductor power device that includes normal FET cells and slow switching FET transistor cells with ballasting source resistors.

FIG. 4 is a cross sectional view for illustrating a semiconductor power device that includes transistor cells according to this invention. The semiconductor power device 200 includes normal FET cells 210 and slow switch FET cells 220 that include ballasting source resistors 230. As shown in FIG. 4, the length of source regions 230 are deliberately increased for the slow witch cells 220 to increase the source resistance of slow cells. Alternatively, the source dopant concentration regions 230 may be decreased to increase the source resistance. Other techniques along or in combination may be utilized to adjust the source resistances in different areas to the desired levels. The slow switching FET cells are therefore provided with increased robustness to sustain higher voltage and current during a turning off operation. The reliability of the semiconductor power device 200 is improved with the slow switching transistor cells having a strengthened robustness. The increase of the Rdson resistance is decreased because only the slow switching transistor cells are added with the ballasting source resistors while the normal FET transistor cells 210 are kept as normal FET cells without adding the ballasting resistors.

Although the present invention has been described in terms of the presently preferred embodiment, it is to be understood that such disclosure is not to be interpreted as limiting. Various alterations and modifications will no doubt become apparent to those skilled in the art after reading the above disclosure. Accordingly, it is intended that the appended claims be interpreted as covering all alterations and modifications as fall within the true spirit and scope of the invention.

We claim:

1. A method for manufacturing a switch comprising:
manufacturing a fast-switch semiconductor power device and a slow-switch semiconductor power device each having a gate to apply a gate voltage thereon for controlling a turn-on and turn-off of a current transmitting therethrough wherein the step of manufacturing said slow-switch semiconductor power device further comprising a step of connecting a robustness increasing circuit to said slow-switch semiconductor power device to handle a higher current and a higher voltage than said fast-switch semiconductor power device and wherein the step further comprising a step of connecting the gate of the slow-switch semiconductor power device through a resistor to the gate of the fast-switch semiconductor power device.

2. The method of claim 1 wherein:
said step of connecting the robustness-increasing circuit to the slow-switch semiconductor power device further includes a step of connecting a ballasting resistor as the robustness-increasing circuit to the gate of said slow-switch semiconductor power device.

3. The method of claim 1 wherein:
said step of manufacturing said fast-switch semiconductor power device and said slow switch semiconductor power device further comprising a step of manufacturing a fast switch metal oxide semiconductor field effect transistor (MOSFET) and a slow switch MOSFET by connecting a ballasting resistor as the robustness-increasing circuit to the gate of the slow switch MOSFET.

4. The method of claim 1 wherein:
said step of manufacturing said slow-switch semiconductor power device further including a step of manufacturing said slow-switch semiconductor power device in a plurality of regions distributed over a semiconductor chip by connecting a ballasting resistor as the robustness-increasing circuit to the gate of the slow switch semiconductor power device in a plurality of regions distributed over the semiconductor chip.

5. The method of claim 1 wherein:
said step of manufacturing said slow-switch semiconductor power device further including a step of disposing said slow-switch semiconductor power device near approximately a central location of a semiconductor chip by connecting a ballasting resistor as the robustness-increasing circuit to the gate of the slow switch semiconductor power device near approximately a central location of the semiconductor chip.

6. The method of claim 1 wherein:
said step of manufacturing said slow-switch semiconductor power device further including a step of disposing said slow-switch semiconductor power device near approximately a peripheral location of a semiconductor chip by connecting a ballasting resistor as the robustness-increasing circuit to the gate of the slow switch semiconductor power device near approximately a peripheral location of the semiconductor chip.

7. The method of claim 1 wherein:
said step of manufacturing said fast-switch and slow-switch semiconductor power devices comprising a step of manufacturing a plurality of fast switch MOSFET cells and a plurality of slow switch MOSFET cells by forming each of said slow switch MOSFET cells with a source ballasting resistor and by connecting a ballasting resistor as the robustness-increasing circuit to the source of the slow switch MOSFET cells.

8. The method of claim 1 wherein:
said step of manufacturing said fast-switch and slow-switch semiconductor power devices comprising a step of manufacturing a plurality of fast switch MOSFET cells and a plurality of slow switch MOSFET cells and manufacturing each of said slow switch MOSFET cells with a source having an greater length with a higher resistance than said fast switch MOSFET cells.

9. The method of claim 1 wherein:
said step of manufacturing said fast-switch and slow-switch semiconductor power devices comprising a step of manufacturing a plurality of fast switch MOSFET cells and a plurality of slow switch MOSFET cells and manufacturing each of said slow switch MOSFET cells with a source having a lower source dopant concentration with a higher resistance than said fast switch MOSFET cells.

* * * * *